METHOD FOR ELECTROLYTICALLY ETCHING AND THEREAFTER ANODICALLY OXIDIZING AN ESSENTIALLY MONOCRYSTALLINE SEMICONDUCTOR BODY HAVING A P-N JUNCTION
Filed June 11, 1957
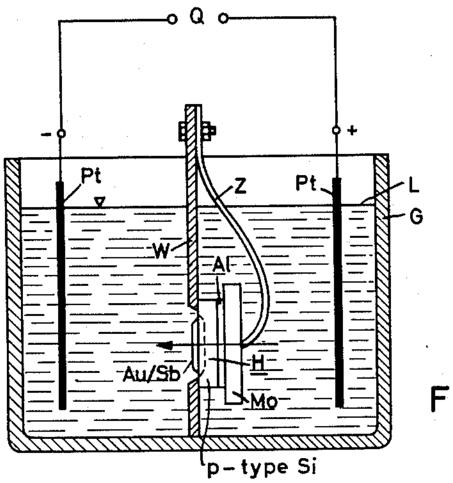
Fig. 1
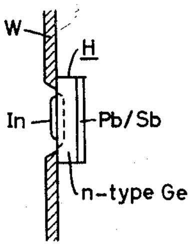
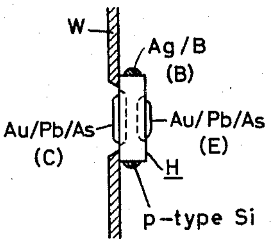
Fig. 2 Fig. 3

United States Patent Office 3,010,885

Patented Nov. 28, 1961

3,010,885

METHOD FOR ELECTROLYTICALLY ETCHING AND THEREAFTER ANODICALLY OXIDIZING AN ESSENTIALLY MONOCRYSTALLINE SEMICONDUCTOR BODY HAVING A P-N JUNCTION

Norbert Schink, Erlangen, Germany, assignor to Siemens-Schuckertwerke Aktiengesellschaft, Berlin-Siemensstadt, Germany, a corporation of Germany Filed June 11, 1957, Ser. No. 665,047

Claims priority, application Germany June 16, 1956

7 Claims. (Cl. 204—32)

This invention relates to procedures and apparatus for electrolytically etching electric semiconductor devices. It particularly concerns electrolytic methods of etching away unwanted material that may form bridging contacts across the p-n junction areas of such devices. It further relates to an after-treatment of the electrolytically etched device, in which treatment a protective coating or film is formed by an electrolytic oxidizing step.

In electric semiconductor devices, particularly those intended for relatively large power requirements, such as junction-type rectifiers, power transistors and the like, the essentially monocrystalline semiconductor body is provided with metallic contacts of the broad-area type. Located in the interior of the semiconductor body is at least one p-n junction which, in the operation of the device, is electrically stressed in the reverse direction, that is, in the direction opposite to current flow. This p-n junction forms the boundary face between two crystal zones of different conductance type. The manufacture of such semiconductor devices requires a number of sequential treatments. After contacting the usually disc-shaped semiconductor crystal, comprising p-conducting silicon for example, with aluminum on one side and with a gold-antimony alloy containing about 1% antimony on the other side, to produce an n-conducting zone there, the p-n limit exterior boundary, that is the line along which the p-n junction area emerges at the semiconductor surface, must be cleaned of any bridging contacts by means of an etching process.

Heretofore a purely chemical etching method using etching solutions of relatively high concentration, has been used for this purpose. This method sometimes results in failure, manifested by impairment of the rectifying effect, particularly when using the usual acid solutions such as hydrofluoric acid, or hydrofluoric acid mixed with nitric acid. The failure can be explained by the fact that the semiconductor devices contain components that are sensitive to certain components or impurities of the etching solution which may be present merely accidentally or may enter during etching. Contamination by such impurities may occur if the contacts of the semiconductor device are composed of different metals or alloys, such as aluminum, tin and molybdenum, one or several of which may be attacked by the etching solution. For that reason it has become necessary to purify the commercially available etching agents carefully before applying them to semiconductor devices, and to always prepare a fresh etching solution for each batch or series of products to be treated. This leads to a relatively high consumption of etching agents and requires great expenditure for their preparation.

The application of electrolytic etching methods in the manufacture of electric semiconductor devices presents difficulties. Unless proper precautions are taken this method may result in loss of the barrier forming ability of the p-n junction.

It is an object of my invention to provide an etching method for electric semiconductor devices which, though involving an electrolytic treatment, obviates the above-mentioned deficiencies of the known methods.

A further object is to protect the etched semiconductor device by an after-treatment, preferably by an anodic oxidation.

To this end, and in accordance with a feature of my invention, I subject the essentially monocrystalline semiconductor bodies, having a p-n transition region, particularly a silicon rectifier disc of this type, to electrolytic etching, taking the following precaution during the etching performance. I maintain the polarization voltage, at the semiconductor surface effective as an electrode surface, below the critical voltage range above which a polishing action is exerted upon the semiconductor surface.

The new method will be further explained with reference to the drawing, in which:

FIG. 1 illustrates in cross section an example of an apparatus for electrolytically etching a semiconductor rectifier unit. The same apparatus, or another of the same kind, is used for the subsequent anodic oxidation; only the electrolyte need be changed.

FIG. 2 illustrates a rectifier, employing n-type germanium, mounted upon an insulating partition; and FIG. 3 illustrates a transistor employing p-type silicon, also so mounted.

An acid resistant vessel G, for example of polystyrole, is provided with two platinum electrodes Pt which are connected to the positive and negative poles of a voltage source Q as illustrated. Located between the electrodes is an insulating partition W likewise of polystyrole. The partition has a circular opening covered by the inserted semiconductor device H to be processed. The semiconductor device comprises a circular p-conducting silicon disc Si with metal contacts bonded to the silicon body, for example, by an alloying process. In the example illustrated in FIG. 1 one of the contacts, designated Al, consists of aluminum and is reinforced by a backing sheet Mo, of molybdenum. The opposite side of the silicon disc is bonded or alloyed together with a gold-antimony contact Au/Sb adjacent to which a small n-conducting zone is located within the silicon crystal. The p-n junction is schematically indicated by a broken line. The section line or region of this junction represents the "exterior p-n limit" mentioned above. It extends, at the semiconductor surface, as an approximately circular line about the likewise circular gold contact Au/Sb, being spaced slightly therefrom. The opening in partition W is larger than the circular gold contact Au/Sb but smaller than the silicon disc Si. A spring strip Z of polyethylene, secured to the partition W, retains the semiconductor unit H in such position that the gold side faces the cathode. Since the semiconductor unit conducts electric current only in the forward direction indicated by an arrow, the source Q may also consist of an alternating-voltage source. The partition W can be pulled out of the processing vessel to exchange the rectifier unit. The electrolyte L is diluted hydrofluoric acid.

The following observations were made in tests of the device described above, in reference to FIG. 1.

When no electric current is passed between the electrodes Pt, the diluted hydrofluoric acid in the vessel does not attack the rectifier unit proper. Only the aluminum reacts very slightly. When voltage is applied to the platinum electrodes, etching commences immediately. The silicon is built down, that is, etched away, anodically. The gold, although likewise located on the anodic side, is not attacked. Only at very high temperatures can some attack be observed. The other side of the semiconductor unit H, on which the aluminum contact Al and the molybdenum plate Mo are located, operates as a cathode and thus is not subject to attack. The quality of the etching can be determined by recording and studying the rectifier characteristics of each processed semiconductor unit by means of a cathode ray oscillograph.

The etching was preferably performed at room temperature (20° C.) with a 4% solution of hydrofluoric acid. One part of concentrated HF (sufficiently pure for use in making analyses) was diluted with distilled water. Only slight changes in concentration and temperature were observed. Essentially determining, however, for the success of the etching method is the selection of the current density obtaining at the attacked semiconductor surface, this density being a criterion for the magnitude of the polarization voltage. High current density, that is, above a critical range, causes a polishing effect. It eliminates relatively large amounts of silicon and produces a glossy surface not wettable by water. The resulting rectifiers have very poor barrier properties. On the other hand, a lower current density, below the critical range, removes little silicon, and produces a dull surface iridescent with the colors of fine layers and wettable by water. However, in order to shorten the overall processing time, and for other reasons, it is advantageous to precede the etching by a somewhat greater removal of material from the surface. This may be done chemically, but is most simply and advantageously accomplished by the above-mentioned use of a high current density. For example, the transition between the two etching effects when processing rectifiers having a circular gold contact Au/Sb of 8 mm. diameter and an opening in partition W of 10 mm. diameter, took place at a current density of about 80 to 100 ma. (milliamps.).

Germanium and silicon may be acidically etched with hydrofluoric acid, preferably of 4% concentration, or in the preferred range of 1 to 10%. For germanium aqueous hydrochloric acid is also suitable, in the same concentration.

In FIG. 2 is illustrated a rectifier employing n-type germanium mounted upon the polystyrole insulating partition W. The partition is to be mounted in vessel G as illustrated in FIG. 1. The rectifier has a barrier-free contact at Pb/Sb, consisting of a lead alloy containing 9% antimony. It also has a barrier contact at In, consisting of indium. A semiconductor device employing p-type germanium can also be treated as described.

The processes described herein are also applicable to $A_{III}B_{V}$ compounds, namely to a binary compound of an element of the group consisting of boron, aluminum, gallium and indium, with an element of the group consisting of nitrogen, phosphorus, arsenic, and antimony.

In FIG. 3 is illustrated a transistor employing p-silicon. The emitter electrode at E is formed of a silver, lead, and arsenic alloy (36:62:2%). The collector electrode is at C. The base electrode, at B, is a silver boron electrode containing 0.5% boron.

The process is also applicable to n-type silicon.

In FIG. 1, the gold-antimony alloy contact at Au/Sb may comprise 1 or 5% antimony. The Au/Sb contact can be replaced by the alloy Au/Pb/As (36:62:2%) or Ag/As (arsenic 5%). The contact at Al can be replaced by Au/B (boron 0.5%), or Ag/B (boron 0.5%).

In the germanium device there may be used, besides indium, a contact of Au/Ga (1% gallium), or Ag/Ga (1% gallium).

The polarization voltage is defined as the difference between the electrode voltage under current flow and the electrode voltage obtaining when no current flows through the bath. By "electrode voltage" is meant the potential difference between the semiconductor member and the neighboring electrolyte.

Between a (111)-crystal surface of a highly purified silicon monocrystal and 4% aqueous fluoric acid, the upper limit of the polarization voltage permissible according to the invention is within the range of 1.6 and 1.9 volts. This range corresponds to a current density of 300 to 350 milliamps. per square centimeter (ma./cm.$^2$) of the semiconductor surface to be etched. For other conditions, or other materials, the critical range can be determined by testing a sample in known manner.

The surface obtained by application of a high polarization voltage and a correspondingly high current density exhibits a high-luster polish and is not wetted by water or by the aqueous fluoric acid solution. In contrast thereto, the surface treated with lower polarization voltage appears dull, it scintillates in interference colors and is wetted by water and hence by the electrolyte. The critical difference between the two etching effects is unambiguously defined by transfer from one to the other condition, when during the etching process the polarization voltage is varied by changing the impressed voltage so as to pass through the critical range. It is then readily and unmistakeably apparent to the naked eye how one etching effects changes to the other. This test is therefore a definite one.

The above-described observations are in harmony with the following theory concerning anoidic electrode reactions. With high anodic loading, the main impediment to current flow does not reside in the passage of the ions of the electrode material from the solid phase into the neighboring body of the solution, but is encountered only within a next adjacent, stationary diffusion zone formed by spent electrolytes. Above any peaks of material protruding from the electrode surface, or other surface irregularities, this diffusion zone is thinner than above the valleys. In consequence, a greater electrochemical potential gradient is located above the peaks, and this increased gradient causes the more rapid dissolution of such peaks and thus converts the surface into a more accurate plane irrespective of the different electrochemical potentials of the ions of the solid phase located at the surface.

With slight or lower anodic loading, the above-mentioned starting conditions are obviated to a great extent. In this case, the etching away or building down of the surface is determined by the bonding energies of the ions located at the surface. The main impediment to the reaction is now to be found in the transfer of the ions of the electrode material from the solid phase into the adjacent zone of liquid solution. There are left behind, at least within certain surface areas, only the ions of the same electrochemical potential.

In summary, the foregoing observations and theory lead to the conclusion that the surface recombination of the semiconductor body remains small, as required for optimum electric properties, if the crystal surface is built down latticewise, accompanied by levelling of the electrochemical potentials of the ions located at the semiconductor surface. This can be achieved if during electrolyte etching the current density, or the polarization voltage occurring at the etched electrode during current flow, is maintained below the above-mentioned critical range. Since the etching effect progresses more slowly with a lower polarization voltage, it is preferable to remain as close to the critical range as is feasible. For the processing of semiconductor units of a given design and given dimensions with the aid of a given etching device, the critical range of the current intensity or current density can be determined by pre-testing, and then the electrical data for the electrolytic treatment under otherwise uniform conditions can be fixed for all subsequent etching operations.

The method according to the invention affords the following advantages over chemical etching. The soldering of an aluminum strip to the rectifier unit is eliminated. Covering of the parts to be protected by applying a varnish is not necessary. Since the etching solution is insensitive to impurities to a greater extent, frequent changing of the solution is not required. The process can be performed by using hydrofluoric acid of commercially available purity, any distillation prior to use being unnecessary. Furthermore, working with the diluted acid is more convenient than the handling of the highly concentrated acids required for chemical etching.

The etched semiconductor units are sensitive to atmospheric influences. However, a protective coating can be produced by anodic oxidation in a weak aqueous acid, particularly a boric acid solution. The device used for this purpose may be the same as that employed for etching. The rectifier disc can remain in the same holder in which it has been etched, and, after rinsing with distilled water, can be transferred to a bath of diluted boric acid. It is disposed in the vessel G in the same manner as described in the drawing, the sole difference being in the electrolyte. In this manner, the treated semiconductor disc can be made insensitive to humidity, and the silicon can be insulated for protection from making undesired metallic contact.

The following performance of the above-described etching method has been found particularly favorable: A rectifier disc is immersed in the bath of hydrofluoric acid as illustrated in the drawing. Only after the elapse of two minutes from the moment of immersion is the exterior direct voltage from source Q applied. For the rectifier unit described and illustrated and having the above-mentioned dimensions, the voltage is to be so adjusted that in the next following two minutes a direct current of about 125 ma. will flow, in the next following two minutes a direct current of approximately 100 ma., and during the subsequent four minutes a direct current of approximately 50 ma. After elapse of the total processing time of ten minutes, the rectifier unit is removed from the etching bath, thoroughly rinsed and subsequently subjected to electrolytic treatment in diluted boric acid for surface oxidation. Thereafter the rectifier unit can be capsuled and subsequently placed into operation.

The anoidic surface oxidation will now be more fully explained.

This step relates to the production of an electric semiconductor device essentially comprising a monocrystalline semiconductor body having a p-n junction, particularly a silicon rectifier disc, upon which metal contacts are mounted and which has been subjected to an etching process, particularly of the nature described above.

The semiconductor, in connection with, and subsequent to, the etching process, is anodically treated for a period of time within an aqueous, weak, but still acidically reacting electrolyte. An insulating protective coating is thus formed on the semiconductor surface by oxidation.

The etching process is intended to improve the electric characteristics of the rectifier, specifically by cleaning, from the external p-n limit or boundry, the electrically conducting "bridges" which may form, upon applying the heat treatment needed to bond the metal contacts to the semiconductor body. The subsequent oxidizing treatment, in accordance with the present invention, has the effect of rendering the etched semiconductor device insensitive, to a great extent, relative to atmospheric influences tending to impair the rectifier characteristics. This effect can be explained by the theory that this subsequent treatment strengthens and thickens the natural and apparently initially porous oxide skin of the semiconductor. This eliminates the danger of an increase in the surface recombination characteristics of the semiconductor crystal, this protective action being due to the fact that the thickened oxide coating produced by the method of the invention is built up by uniformly continuing the regular lattice structure of the crystal.

A protective coating need only be present at those locations of the semiconductor surface which have previously been etched. For that reason, a subsequent processing according to the invention can be performed with the same holding device as used for the preceding electrolytic etching process.

The electrolyte employed is preferably a boric acid solution, $H_3BO_3/H_2O$. An aqueous solution saturated at normal room temperature (20° C.) is suitable. However, other weak acids may also be used.

The concentration of the boric acid is preferably between 0.1% and 5%, the percentage being by weight. Saturation occurs at 20° C.

Instead of boric acid there may be used carbonic acid ($CO_2$) in water at a concentration of approximately 0.1%, or phenol ($C_6H_5OH$) in water (i.e. carbolic acid), in a concentration between 0.1 and 8%.

The preferred weak acids have dissociation constants between $10^{-6}$ and $10^{-11}$. For example that of phenol is $1.28\times10^{-10}$ at 20° C., and that of carbonic acid is $4.31\times10^{-7}$ at 25° C. Formic acid and acidic acid are too strong.

When applying the method according to the invention to a previously etched silicon rectifier device whose gold contact Au/Sb had a diameter of 8 mm., within a device as illustrated and having a partition opening of 8 mm. diameter, a direct voltage of 200 volts was applied to the two electrodes of the electrolytic bath for a period of 5 minutes. The current intensity during the processing period was 5 to 10 ma. By applying this treatment the rectifier units were rendered so insensitive that even their subjection to humid air, for instance by breathing against them, had no detrimental effect. Furthermore, the semiconductor body at the areas thus processed was effectively insulated against metallic contact. For that reason, the subsequent manufacturing steps designed to capsule the semiconductor devices could be considerably simplified, because such capsuling could be applied during much longer periods than had been previously permissible, and the otherwise necessary precautionary expedients to prevent subsequent contamination could be eliminated, to a large extent.

I claim:

1. The method of treating a substantially monocrystalline semiconductor device having a p-n junction and having a surface at which said p-n junction emerges, which comprises anodically etching away material from said surface in an electrolytic bath, to eliminate a short circuit, maintaining said surface during at least the last stage of etching at a polarizing electric potential below the critical range required for electrolytic polishing of said surface, said polarizing electric potential being sufficiently low to cause said surface to scintillate in interference colors and to be wetted by water, and thereafter, in a separate step, subjecting said surface to anodic oxidation, in an aqueous acid having a dissociation constant between about $10^{-6}$ and $10^{-11}$, to provide a protective coating.

2. The method of treating an electric rectifier device having a substantially monocrystalline semiconductor body of silicon, the body having a p-n junction and having a surface at which said p-n junction emerges, which comprises anodically etching away silicon from said surface of said body in an electrolytic bath of aqueous hydrofluoric acid while maintaining at said surface a polarizing voltage below the critical range of electrolytic polishing, said polarizing electric potential being sufficiently low to cause said surface to scintillate in interference colors and to be wetted by water, and thereafter anodically oxidizing said surface in boric acid to provide a protective coating.

3. The method of treating a substantially monocrystalline semiconductor device having a p-n junction and having a surface at which said p-n junction emerges, which comprises anodically etching said surface in an electrolytic bath, and maintaining at said surface during at least the last stage of the etching a polarizing electric voltage below the critical range of electrolytic polishing, said polarizing electric potential being sufficiently low to cause said surface to scintillate in interference colors and to be wetted by water.

4. The method of treating a substantially monocrystalline semiconductor device having a p-n junction and having a surface at which said p-n junction emerges, which comprises submerging said device in an electrolytic bath with said surface forming an anode, applying at said surface during a first etching stage a polarizing electric potential within the range of electrolytic polishing to thereby pre-etch and polish said body, and thereafter applying at said surface and within the same bath a second polarizing electric potential below said range, said second polarizing potential being sufficiently low to cause said surface to scintillate in interference colors and to be wetted by water.

5. The method of treating a substantially monocrystalline semiconductor device having a p-n junction and having a surface at which said p-n junction emerges, which comprises submerging said device in an electrolytic bath with said surface forming an anode, applying at said surface during a first etching stage a polarizing electric potential within the range of electrolytic polishing to thereby pre-etch and polish said body, thereafter applying at said surface and within the same bath a second polarizing electric potential below said range, said second polarizing potential being sufficiently low to cause said surface to scintillate in interference colors and be wetted by water and then subjecting the etched body to electrolytic surface oxidation in weak aqueous acid having a dissociation constant between about $10^{-6}$ and about $10^{-11}$, to provide a protective coating.

6. The method of treating an electric semiconductor device having a substantially monocrystalline semiconductor body of silicon, the body having a p-n junction and having a surface at which said p-n junction emerges, which comprises anodically etching away material on the said surface of said silicon body in an electrolytic bath formed of an aqueous solution of hydrofluoric acid of about 4% concentration, and maintaining at said surface during etching a polarizing electric voltage below the critical range of electrolytic polishing, said critical range being from about 1.6 to 1.9 volts, corresponding to a current density of about 300 to 350 milliamperes per square centimeter of the surface being etched.

7. The method of treating a substantially monocrystalline semiconductor device having a p-n junction and having a surface at which said p-n junction emerges, which comprises submerging said device in a dilute aqueous acidic electrolytic bath with said surface forming an anode and applying electrolyzing voltage to etch bridging contact material from said surface at said emerging p-n junction, maintaining at said surface during at least the final etching period a polarizing voltage below the minimum required for electrolytic polishing effect, said polarizing voltage being sufficiently low to cause said surface to scintillate in interference colors and to be wetted by water, and thereafter, in a separate step, subjecting the etched surface to anodic surface oxidation, in an aqueous acid having a dissociation constant between about $10^{-6}$ and about $10^{-11}$, to provide a protective coating.

References Cited in the file of this patent

UNITED STATES PATENTS

| | | |
|---|---|---|
| 2,560,792 | Gibney | July 17, 1951 |
| 2,656,496 | Sparks | Oct. 20, 1953 |
| 2,686,279 | Barton | Aug. 10, 1954 |
| 2,783,197 | Herbert | Feb. 26, 1957 |
| 2,802,159 | Stump | Aug. 6, 1957 |
| 2,806,189 | Dymon | Sept. 10, 1957 |
| 2,885,608 | Bradley | May 5, 1959 |

OTHER REFERENCES

Journal of The Electrochemical Soc., vol. 103 (April 1956), pp. 252–256.

Journal of The Electrochemical Soc., vol. 103, February 1956, pp. 132–34.